(12) United States Patent
Mege et al.

(10) Patent No.: US 9,496,903 B2
(45) Date of Patent: Nov. 15, 2016

(54) METHOD FOR REDUCING THE CREST FACTOR WIDE BAND SIGNAL

(71) Applicant: AIRBUS DS SAS, Elancourt (FR)

(72) Inventors: Philippe Mege, Bourg la Reine (FR); Christophe Molko, Villepreux (FR)

(73) Assignee: AIRBUS DS SAS, Elancourt (FR)

( * ) Notice: Subject to any disclaimer, the term of this patent is extended or adjusted under 35 U.S.C. 154(b) by 0 days.

(21) Appl. No.: 14/800,289

(22) Filed: Jul. 15, 2015

(65) Prior Publication Data

US 2016/0149600 A1 May 26, 2016

(30) Foreign Application Priority Data

Jul. 15, 2014 (FR) ..................................... 14 01582

(51) Int. Cl.
*H04B 1/04* (2006.01)
*H04B 1/66* (2006.01)
*H04L 27/26* (2006.01)

(52) U.S. Cl.
CPC .............. *H04B 1/0475* (2013.01); *H04B 1/04* (2013.01); *H04B 1/66* (2013.01); *H04L 27/2621* (2013.01); *H04L 27/2627* (2013.01); *H04B 2001/0425* (2013.01)

(58) Field of Classification Search
CPC .......... H04L 27/2621; H04L 27/2627; H04B 2001/0425; H04B 1/0475
See application file for complete search history.

(56) References Cited

U.S. PATENT DOCUMENTS

| 5,201,071 | A | 4/1993 | Webb | |
|---|---|---|---|---|
| 6,445,747 | B1 | 9/2002 | Jafarkhani et al. | |
| 2004/0008616 | A1* | 1/2004 | Jung | H04L 27/2621 370/203 |
| 2004/0264595 | A1* | 12/2004 | Kim | H04L 27/2614 375/296 |
| 2006/0105723 | A1* | 5/2006 | Anvari | H04B 1/0475 455/114.2 |
| 2008/0265996 | A1* | 10/2008 | Kim | H03F 1/3247 330/291 |
| 2010/0309834 | A1* | 12/2010 | Fischer | H04B 7/0452 370/312 |
| 2012/0155572 | A1* | 6/2012 | Kim | H03F 1/3247 375/297 |
| 2014/0362951 | A1* | 12/2014 | Fehri | H04L 27/2623 375/297 |
| 2015/0180426 | A1* | 6/2015 | Kingsley | H03F 1/565 330/277 |
| 2015/0195115 | A1* | 7/2015 | Yu | H04L 27/2621 375/295 |

FOREIGN PATENT DOCUMENTS

| EP | 1 515 504 A1 | 3/2005 |
|---|---|---|
| WO | WO 96/13918 | 5/1996 |
| WO | WO 2010/139095 A1 | 12/2010 |

OTHER PUBLICATIONS

Preliminary Search Report as issued in French Patent Application No. 1401582, dated Apr. 22, 2015.
Gimlin, D.R. et al., "On Minimizing the Peak-to-Average Power Ratio for the Sum of N Sinusoids," IEEE Transactions on Communications. vol. 41, No. 4, Apr. 4, 1993, pp. 631-635.
Jiang, T. et al., "On Minimizing the Peak-to-Average Power Ratio of Multi-carrier Modulation Signals Using Simulated Annealing," IEEE EIT 2007 Proceedings, pp. 43-46.
Aggarwal, A. et al., "Minimizing the Peak-to-Average Power Ratio of OFDM Signals via Convex Optimization," IEEE Globecom Telecommunications Conference, Dec. 2003, pp. 2385-2389.

* cited by examiner

*Primary Examiner* — Kenneth Lam
(74) *Attorney, Agent, or Firm* — Pillsbury Winthrop Shaw Pittman LLP (57) ABSTRACT

A method for reducing the crest factor of a wideband signal including N narrowband signals, N being a natural integer greater than or equal to two, the method, implemented by an emitting equipment, including phase shifting the narrowband signals between them in such a way as to reduce the crest factor.

9 Claims, 5 Drawing Sheets

METHOD FOR REDUCING THE CREST FACTOR WIDE BAND SIGNAL

CROSS-REFERENCE TO RELATED APPLICATIONS

This application claims priority to French Patent Application No, 14/01582, filed Jul. 15, 2014, the entire content of which is incorporated herein by reference in its entirety.

TECHNICAL FIELD

This invention relates to systems for amplifying and emitting wideband signals comprising several narrowband signals. The invention relates more particularly to reducing the crest factor of a wideband signal as well as emitting equipment and a corresponding computer programme.

PRIOR ART

Transmissions referred to as "multi-carrier", for example of the OFDM type, are more and more frequently used and have in particular been adopted in the LTE ("Long Term Evolution"), TEDS ("TETRA Enhanced Data Service"), DAB ("Digital Audio Broadcasting") and DVB-T ("Digital Video Broadcasting-Terrestrial") systems.

In multi-carrier transmission systems, the data is generally encoded in the form of symbols sent by emitting equipment, called in what follows "emitter", in signals emitted over a plurality of sub-carriers with different frequencies intended for receiving equipment, called in what follows "receiver".

In order to allow these signals to easily reach the receiver, the emitter comprises in a known way an amplifier that increases the power of the signals before they are emitted. Such a power amplifier transforms the input signal into an output signal of higher power.

A power amplifier of wideband signals is in general linearized in such a way that, for an input signal of which the power is located below a certain limit the output signal is proportional or quasi-proportional to the input signal (the signal is said to be in the interval referred to as "linearity" of the power amplifier).

When the amplitude value of the input signal exceeds the maximum upper limit of the linearity interval, the power amplifier operates in an amplitude interval of the input signal referred to as "non-linearity" for which the output signal of the amplifier is limited. The frequency spectrum of the signal is then widened and the components of the power amplifier can become unduly degraded, which has disadvantages.

In a multi-carrier transmission system, the use of a plurality of sub-carriers for transmitting the data can create amplitude peaks, which depend in particular on the number of sub-carriers. These amplitude peaks can reach values that can exceed the maximum upper limit of the interval of linearity of the power amplifier, then resulting in the aforementioned disadvantages.

In order to overcome at least partially these disadvantages, it is known to size the amplifier in relation to the peaks of the signal in such a way that the amplification of the signal is linear across the entire range of variation of said signal.

In practice, for this purpose, it is sought to reduce the crest factor (Peak-to-Average Power Ratio or PAPR) of the signal, i.e. the ratio between the peak amplitude of the signal and its effective value, in such a way that it is within the region of linearity of the amplifier. Indeed, reducing the crest factor allows for an increase in the effective value of the signal, which is the "useful" value that characterises the power transmitted, and which is therefore the value to maximise. The crest factor represents the margin between the maximum power of the amplifier (the power for which it is sized), and the power actually transmitted, that is why it is important to minimise the crest factor so as to dimension the power amplifier as close as possible with respect to the power to be transmitted, which makes it possible in particular to reduce the volume and the mass of the amplifier and to limiter its energy consumption.

The methods known for reducing the crest factor all have the major disadvantage of resulting in a degradation of the signal.

In addition, in the case of a plurality of narrowband signals sent in a wideband signal, for example signals of the TETRA or TETRAPOL type sent in a wideband signal, the presence of sequences of symbols (called "training sequences") that are common between the signals and synchronous between them increases their coherence and therefore affects the statistic distribution of the amplitudes by increasing the probability of occurrence of the highest amplitudes, which requires, with existing solutions, a reduction in the amplitude of the signal which will degrade the useful signals and which is therefore a problem.

General Presentation of the Invention

This invention aims to overcome at least partially these disadvantages by proposing an effective and easy to implement method for reducing the crest factor of a wideband signal making it possible to reduce the crest factor and to optimise the statistic distribution of the amplitudes of said wideband signal so as to substantially limit and even suppress the degradation of narrowband signals included in the wideband signal.

To this effect, the invention firstly relates to a method for reducing the crest factor of a wideband signal comprising N narrowband signals, N being a natural integer greater than or equal to two, the method, implemented by an emitting equipment, being remarkable in that it comprises a step of phase shifting the narrowband signals between them in such a way as to reduce said crest factor.

The terms "wideband signal" mean a signal occupying a frequency band that is wider than the sum of the widths of the bands of the various "narrowband signals" which are transmitted in this said "wideband signal". The width of a wideband signal, for example in a network of the 3GPP LTE type well known to those skilled in the art, is typically between 1 and 20 MHz.

The terms "narrowband signal" mean a signal occupying a low frequency band, for example signals of the TETRA type well known to those skilled in the art, of which the width is typically less than 200 kHz (between 25 and 150 kHz in a TETRA network).

The terms "wideband signal comprising a plurality of narrowband signals" mean that the plurality of the narrowband signals are transmitted in the band of the wideband signal.

The phase shift of the narrowband signals advantageously makes it possible to substantially reduce the crest factor of the wideband signal.

Furthermore, when the narrowband signals are at least partially coherent between them, the method according to the invention makes it possible to optimise the statistic distribution of the amplitudes of the wideband signal. The term "coherent" means the presence of common sequences of symbols between the signals and synchronous between them. Such sequences are commonly referred to as "training sequences" by those skilled in the art.

Preferably, the phase shift values of the narrowband signals are determined in a preliminary step.

Still preferably, the phase shift values of the narrowband signals are determined periodically so as to reduce the crest factor and, when the narrowband signals are at least partially coherent between them, to optimise the statistic distribution of the amplitudes of the wideband signal over time.

Advantageously, the method comprises a preliminary step of initialising the phase shift values of the narrowband signals, for example by choosing them randomly.

In a preferred embodiment of the method according to the invention, the phase shift values of the narrowband signals are determined using signals emitted at a prior instant by the emitting equipment. This makes it possible to optimise the reducing of the crest factor of the wideband signal and, when the narrowband signals are at least partially coherent between them, the statistic distribution of the amplitudes of the wideband signal.

According to an aspect of the invention, the emitting equipment comprising a power amplifier and/or a power amplification simulator, the phase shift values of the narrowband signals are determined using the error (or difference) between the value of the signal amplified by said power amplifier or said power amplification simulator and the value of the signal generated by the generation module.

Advantageously, the emitting equipment comprising a power amplifier and/or a power amplification simulator, the phase shift values of the narrowband signals are determined by minimising the squared error between the value of the signal amplified by said power amplifier or said power amplification simulator and the value of the signal generated by the generation module so as to optimally reduce the crest factor and, when the narrowband signals are at least partially coherent between them, to optimise the statistic distribution of the amplitudes of the wideband signal.

Preferably, the phase shift values of the narrowband signals are determined by using a stochastic gradient that minimises said squared error, which makes it possible to obtain over time a minimum crest factor, and, when the narrowband signals are at least partially coherent between them, an optimum statistic distribution of the amplitudes of the wideband signal.

Preferably, the pitch of the algorithm of the stochastic gradient, used to determine the phase shift values of the narrowband signals, is faster over the portions of time where the narrowband signals, expressed as base band, are at least partially coherent between them, and slower over the other portions of time.

Advantageously, the algorithm of the stochastic gradient, used to determine the phase shift values of the narrowband signals, is applied only over the portions of time where the narrowband signals, expressed as base band, are coherent between them.

In another embodiment, the phase shift values of the narrowband signals are determined randomly, more preferably periodically, which is easier to carry out.

In another embodiment, the phase shifting of the narrowband signals is carried out by temporally shifting the narrowband signals in relation to one another.

The invention also relates to an emitting equipment comprising a generation module of a wideband signal using N narrowband signals, N being a natural integer greater than or equal to two, and a power amplifier of said wideband signal, said emitter equipment being remarkable in that the generation module is configured to phase shift the narrowband signals between them in such a way as to reduce the crest factor of the wideband signal and, when the narrowband signals are at least partially coherent between them, to optimise the statistic distribution of the amplitudes of the wideband signal.

In an embodiment, the emitting equipment comprises a power amplification simulator configured to simulate the amplification of a wideband signal generated by the generation module.

The invention also relates to a computer programme comprising instructions for implementing the method of the invention when the programme is executed by at least one processor.

Figure 4:
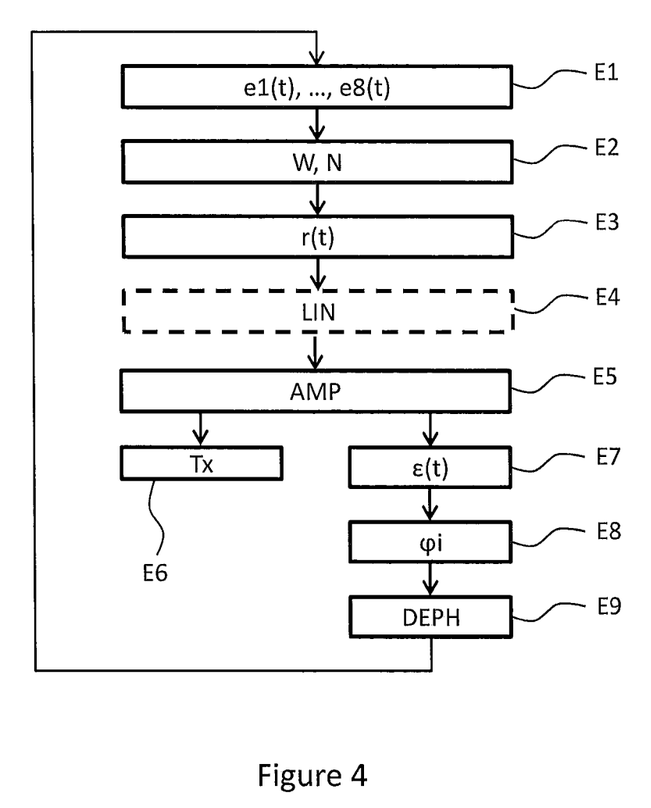
FIG. 4 diagrammatically shows a first embodiment of the method according to the invention by the emitting equipment of FIG. 1.
Figure 5:
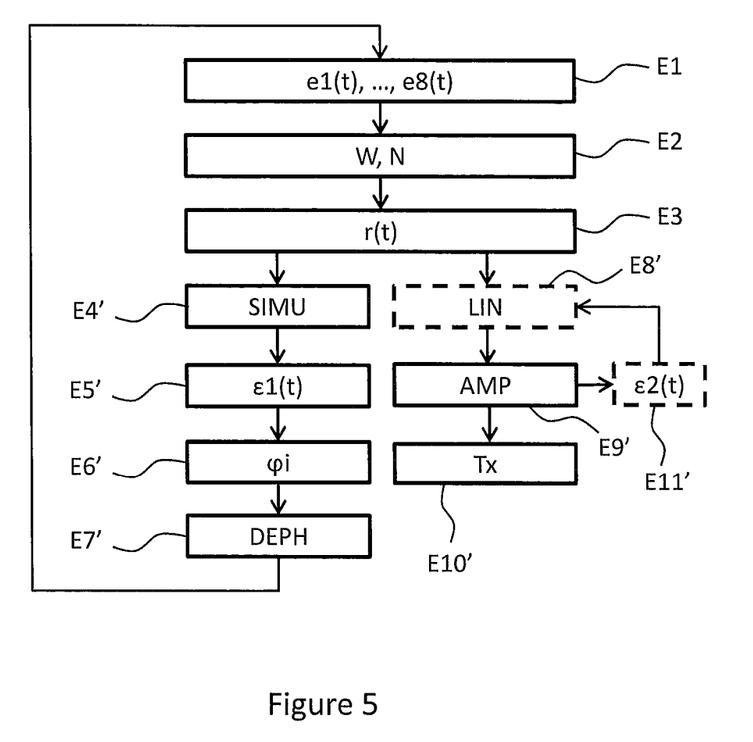
FIG. 5 diagrammatically shows a second embodiment of the method according to the invention by the emitting equipment of FIG. 2.

The block diagrams of FIGS. 4 and 5 diagrammatically show the unfolding of this computer programme, for preferred embodiments of the invention.

DESCRIPTION OF THE FIGURES

Embodiments of the invention shall now be described more precisely but not restrictively with regards to the annexed drawings wherein.

DETAILED DESCRIPTION OF THE INVENTION

I. Emitting Equipment 2A/2B

Figure 1:
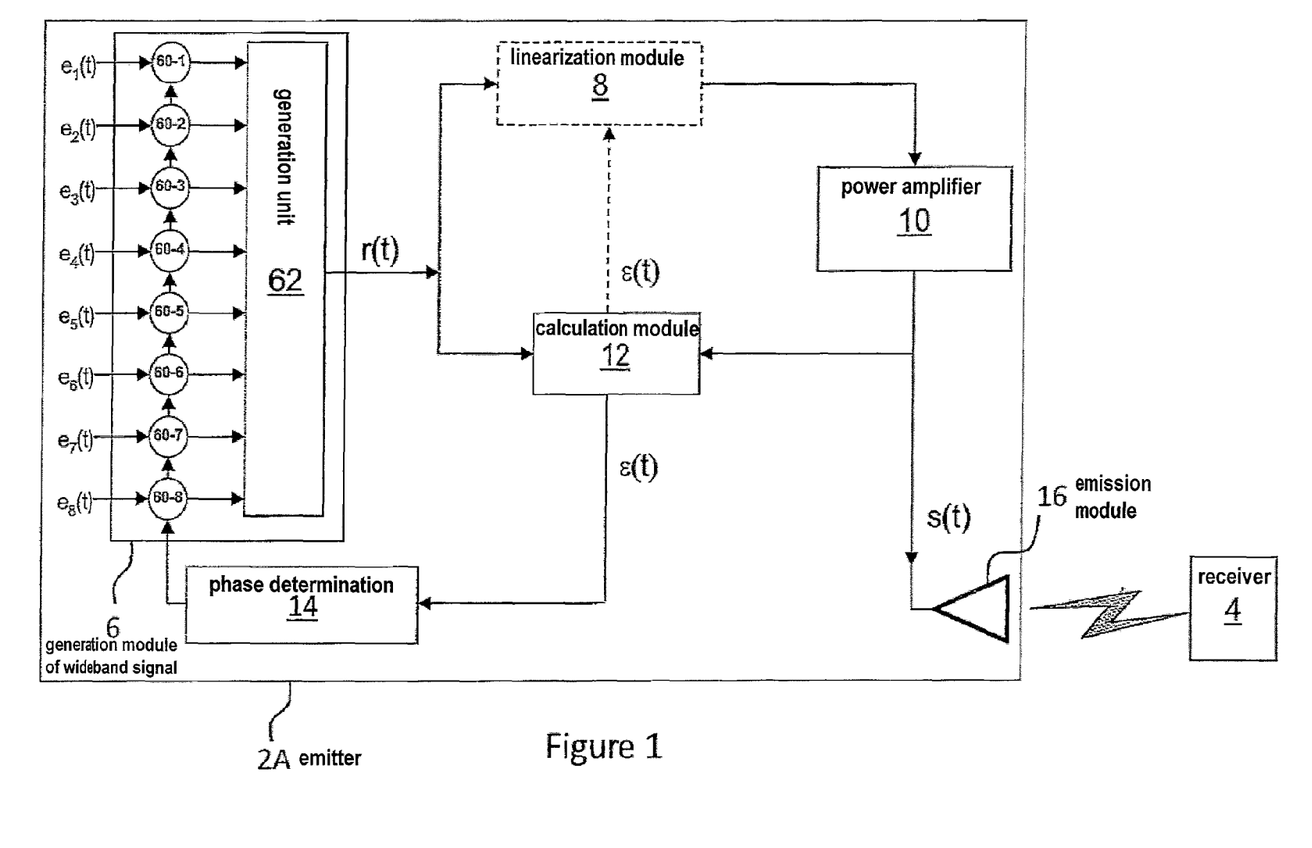
FIG. 1 diagrammatically shows a first embodiment of an emitting equipment according to the invention.
Figure 2:
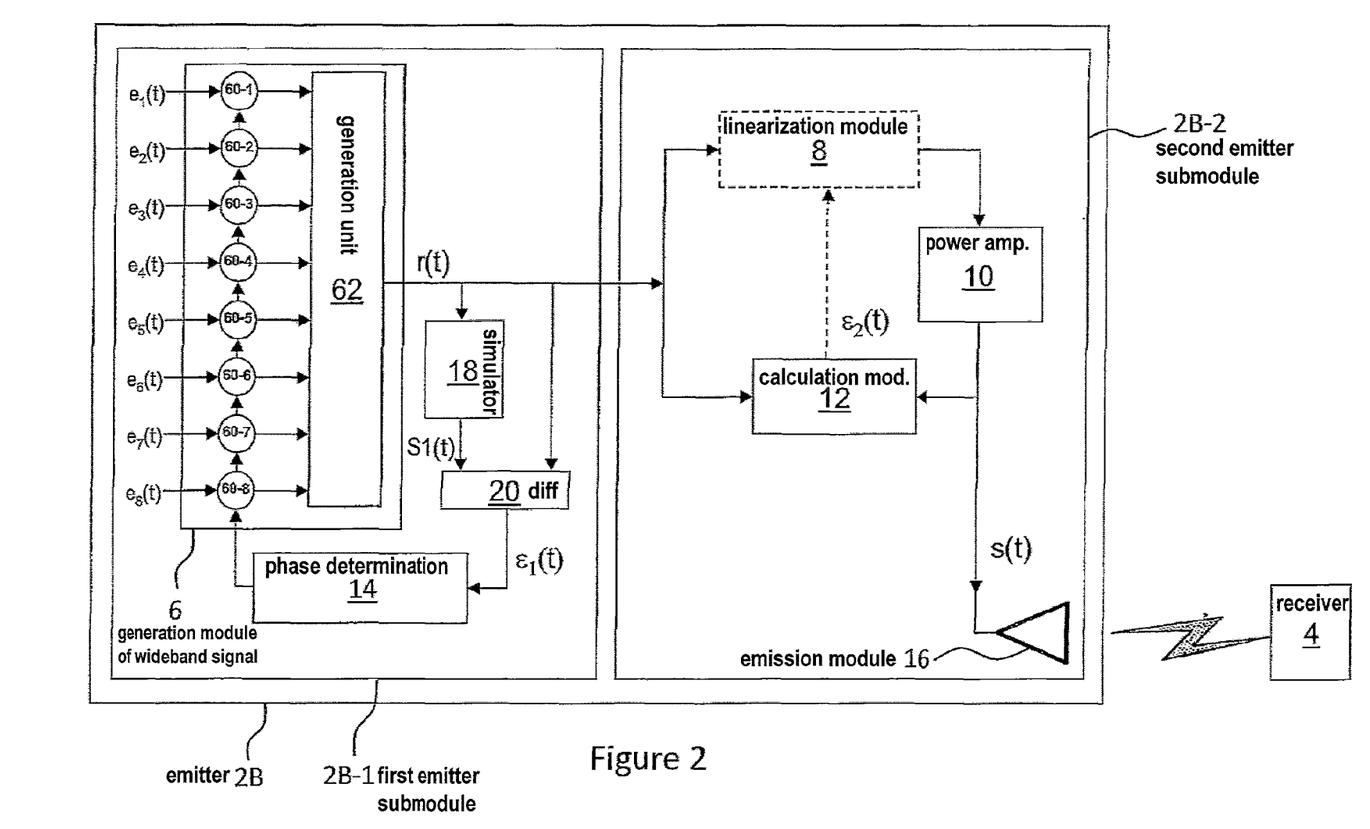
FIG. 2 diagrammatically shows a second embodiment of an emitting equipment according to the invention.

FIGS. 1 and 2 show an emitting equipment 2A/2B of a system for transmitting a plurality of narrowband signals in the same wideband signal, as for example a base station of a PMR ("Professional Mobile Radio") system of the TETRAPOL type with several TETRAPOL signals transmitted in the same wideband signal.

The emitter 2A/2B is configured to emit a wideband signal intended for a receiver 4.

For this purpose, the emitter 2A/2B comprises a generation module 6 of a wideband signal using the narrowband signals, a linearization module 8, a power amplifier 10, an error calculation module 12, a module for determining phase shifts 14 and an emission module 16.

The wideband signal emitted by the emitter 2A/2B comprises a number N of narrowband signals $e_1(t), \ldots, e_N(t)$ where N is a natural integer greater than or equal to 2. The invention makes it possible to phase shift these signals $e_1(t), \ldots, e_N(t)$ using phase shift values $\phi_1, \ldots, \phi_N$.

For reasons of clarity, the invention shall be described in reference to a wideband signal comprising N=8 narrowband signals $e_1(t), \ldots, e_8(t)$. This obviously does not limit the scope of this invention, as the number of narrowband signals can be any natural integer greater than or equal to two.

a) Generation Module 6 of a Wideband Signal

The generation module 6 is configured to:
- receive eight narrowband signals $e_1(t), \ldots, e_8(t)$, each one of the eight narrowband signals comprising a plurality of symbols,
- phase shift each one of the eight narrowband signals $e_1(t), \ldots, e_8(t)$ received using the phase shift values received,
- generate a wideband signal using eight narrowband signals $e_1(t), \ldots, e_8(t)$ phase shifted between them.

The generation module 6 comprises eight phase configuration units 60-1, ... 60-8 and a unit for generating 62 a wideband signal.

The eight phase configuration units 60-1, ... 60-8 are each configured to receive one and only one of the eight narrowband signals $e_1(t), \ldots, e_8(t)$ and to modify its phase using a phase shift value $\phi_1, \ldots, \phi_8$ supplied by the phase determination module 14 described hereinafter in such a way that the narrowband signals $e_1(t), \ldots, e_8(t)$ are phase shifted between them.

The generation unit 62 is configured to generate a wideband signal using the eight narrowband signals $e_1(t), \ldots, e_8(t)$ phase shifted by the phase configuration units 60-1, ... 60-8.

For example, the narrowband signals $e_1(t), \ldots, e_8(t)$ can each be received in base band, in the form of complex signals. In order to phase shift these signals, respectively with the phase shift values $\phi_1, \ldots, \phi_8$, it is sufficient to multiply each one of these signals, respectively by $e^{j \cdot \phi_i}$, where j represents the pure imaginary complex number square root of −1. Then each one of these narrowband signals $e_1(t), \ldots, e_8(t)$ is placed on its carrier frequency, the wideband signal obtained r(t) then comprises all of the wideband signals each on its carrier frequency and with the desired phase shift.

b) Linearization Module 8

The linearization module 8, which is optional, is a function which is generally associated with power amplifiers and which has for role to pre-distort the signals to be sent to the power amplifier 10 in such a way that the global response of the power amplifier associated with this linearization module is as linear as possible and within the greatest interval of linearity. In general, this linearization module 8 adapts the pre-distortion that it applies to the signals to be sent to the power amplifier 10 according to the error coming from the error calculation module 12.

c) Power Amplifier 10

The power amplifier 10 is configured to increase the power of a wideband signal r(t) generated by the generation module 6 (and pre-distorted by the linearization module 8 where applicable).

Such a power amplifier 10 amplifies the wideband signal r(t) linearly within a linearity interval, defined by the electronic components of the power amplifier 10, and non-linearly outside of said linearity interval.

d) Error Calculation Module 12

The error calculation module 12 is configured to:
- receive a wideband signal r(t) generated by the generation module 6,
- receive a signal s(t) amplified by the power amplifier 10, and
- determine the error, or difference, between the wideband signal r(t) generated by the generation module 6 received and the amplified signal s(t) received.

e) Phase Determination Module 14

The phase determination module 14 is configured to receive the error E(t) determined by the error calculation module 12 and to calculate a plurality of phase shifts $\phi_1, \ldots, \phi_8$ for the plurality of narrowband signals $e_1(t), \ldots, e_8(t)$, these phase shifts being different between them, in such a way as to reduce the crest factor of the wideband signal r(t) and, when the narrowband signals $e_1(t), \ldots, e_8(t)$ are at least partially coherent between them, to optimise the statistic distribution of the amplitudes of the wideband signal r(t).

In the embodiments described hereinafter, the phase determination module 14 is configured to calculate the phase shifts $\phi_1, \ldots, \phi_8$ of the narrowband signals $e_1(t), \ldots, e_8(t)$ by minimising, using an algorithm of the stochastic gradient, the squared error, this error being that calculated by the error calculation module 12.

Such a method makes it possible to determine optimum values for the phase shifts $\phi_1, \ldots, \phi_8$ for the narrowband signals $e_1(t), \ldots, e_8(t)$ in such a way as to obtain a minimum crest factor for the wideband signal r(t) and, when the narrowband signals $e_1(t), \ldots, e_8(t)$ are at least partially coherent between them, to optimise the statistic distribution of the amplitudes of the wideband signal r(t).

This does not however limit the scope of this invention in that any other known method can be used to phase shift narrowband signals $e_1(t), \ldots, e_8(t)$ between them in such a way as to reduce the crest factor of the wideband signal r(t) and, when the narrowband signals $e_1(t), \ldots, e_8(t)$ are at least partially coherent between them, to optimise the statistic distribution of the amplitudes of the wideband signal r(t).

As such, for example, the phase shifting of the narrowband signals $e_1(t), \ldots, e_8(t)$ can be obtained by any suitable means, for example by modifying the sampling instants of the narrowband signals $e_1(t), \ldots, e_8(t)$ by the generation module 8 of a wideband signal in such a way that they are temporally shifted between them.

f) Emission Module 16

The emission module 16 is configured to emit the signal amplified s(t) by the power amplifier 10. For this purpose, the emission module 16 comprises in a known manner a signal emission antenna.

The generation module 6 of a wideband signal r(t), the linearization module 8, the power amplifier 10, the error calculation module 12, the phase determination module 14 and the emission module 16 mentioned hereinabove are common to the two embodiments described of the emitter 2A/2B according to the invention.

In the second embodiment of the emitter 2B according to the invention shown in FIG. 2, the emitter 2B further comprises a power amplification simulator 18 and a signal differentiator 20.

Such a configuration makes it possible to physically separate the generation module 8 and the power amplifier 10, in the case, for example, where they are not implemented on the same electronic circuit or for the case where it is desired only to reduce the crest factor of the wideband signal r(t) (and, when the narrowband signals $e_1(t), \ldots, e_8(t)$ are at least partially coherent between them, optimiser the statistic distribution of the amplitudes of the wideband signal r(t)) without systematically sending the wideband signal r(t) to an actual and effective power amplifier such as the power amplifier 10.

For this purpose, the emitter 2B is divided into a first emitter sub-module 2B-1, and into a second emitter sub-module 2B-2, for example each comprised in a physical entity different from the emitting equipment 2B (without this limiting the scope of this invention).

The first emitter sub-module 2B-1 comprises the generation module of a wideband signal 6, the phase determination module 14, the power amplification simulator 18 and the signal differentiator 20.

The second emitter sub-module 2B-2 comprises the linearization module 8, the power amplifier 10, the error calculation module 12 and the emission module 16.

g) Power Amplification Simulator 18

The power amplification simulator 18 can be seen as a virtual power amplifier that simulates an amplification of the wideband signal in a way similar to the power amplifier 10 in order to determine phase shift values that make it possible to reduce the crest factor of the wideband signal r(t) and, when the narrowband signals $e_1(t), \ldots, e_8(t)$ are at least partially coherent between them, to optimise the statistic distribution of the amplitudes of the wideband signal r(t).

Such a simulator 18 makes it advantageously possible to obtain different phase shift values $\phi_1, \ldots, \phi_8$ for the narrowband signals $e_1(t), \ldots, e_8(t)$, and therefore to reduce the crest factor of the wideband signal r(t) (and when the narrowband signals $e_1(t), \ldots, e_8(t)$ are at least partially coherent between them, to optimise the statistic distribution of the amplitudes of the wideband signal r(t)) before actually amplifying the wideband signal r(t) (via the power amplifier 10) and to emit said amplified signal s(t).

The actual power amplifier 10 therefore receives a wideband signal r(t) (possibly pre-distorted) of which the crest factor has already been substantially reduced and of which the variations in amplitude are as such already included in the linearity interval of the power amplifier 10 or of which the occurrences of the variations in amplitude that exceed the linearity interval of the power amplifier 10 are minimised.

The power amplification simulator 18 uses a mathematical function f that makes it possible to simulate the power amplifier 10. In other terms, the power amplification simulator 18 determines a simulated output signal $s1(t)$ that corresponds to a signal amplified by the power amplifier 10 using a wideband signal r(t) received from the generation module 6.

Figure 3:
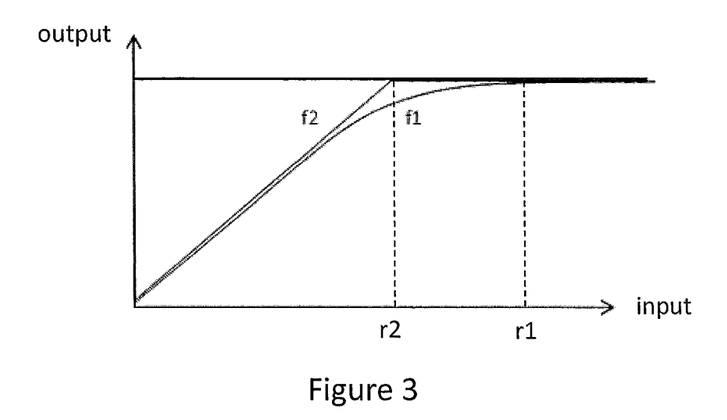
FIG. 3 shows two examples of curves representing two amplification simulation functions.

In reference to FIG. 3, the mathematical function f is a compression function with a maximum output value called the "Target" which is reached when the input value increases beyond a maximum input limit. As such, when the input value is less than the maximum input limit, the output value is about the input value.

Two simple function examples f1 and f2 are shown in FIG. 3 wherein the functions f1 and f2 increase up to a "Target" limit value for values greater than input values respectively r1 and r2. The "Target" values, r1 and r2, can be expressed either in terms of amplitude (for example in μv or in dB μv), or in terms of power (for example in mW or in dBm).

h) Signal Differentiator 20

The signal differentiator 20 is configured to receive the wideband signal r(t) generated by the generation module 6 and the signal simulated $s1(t)$ by the power amplification simulator 18 and to determine the difference between these two signals, in a way similar to the error calculation module 12.

In this second embodiment shown in FIG. 2, the phase determination module 14 is configured to calculate a plurality of phase shifts $\phi_1, \ldots, \phi_8$, different between them, for the plurality of narrowband signals $e_1(t), \ldots, e_8(t)$ using the error $\epsilon_1(t)$ determined by the signal differentiator 20 (and no longer by the error calculation module 12).

Note that, in this second embodiment, the error calculation module 12 calculates, using the wideband signal r(t) generated by the generation module 6 and the signal s(t) amplified by the power amplifier 10, an error $\epsilon_2(t)$ that it provides to the linearization module 8.

The structure of the emitter 2 according to the invention having been described, details on the operation of the method for reducing the crest factor implemented by said emitter 2 shall now be given.

II. Implementation

The method according to the invention is described hereinafter according to two embodiments corresponding to the two embodiments of the emitter 2 described hereinabove in reference to FIGS. 1 and 2. These embodiments of the method according to the invention are described hereinafter respectively in reference to FIGS. 4 and 5.

a) First Embodiment of the Method According to the Invention

This first embodiment, shown in FIG. 4, is implemented by the emitting equipment 2A shown in FIG. 1.

As explained hereinabove, the emitter 2A comprises a generation module 6 of a wideband signal r(t), a linearization module 8, a power amplifier 10, an error calculation module 12, a phase determination module 14 and an emission module 16.

Each phase configuration unit 60-1, . . . , 60-8 of the generation module 6 receives:

in a step E1, one of the eight associated narrowband signals $e_1(t), \ldots, e_8(t)$, and in a step E2, which can be concomitant to the step E1, a phase shift value $\phi_1, \ldots, \phi_8$ associated with said narrowband signal $e_1(t), \ldots, e_8(t)$ sent by the phase determination module 14.

During the putting into operation of the emitter 2A, predetermined phase shift values $\phi_{0-1}, \ldots, \phi_{0-8}$, for example chosen randomly, can be provided for each signal $e_1(t), \ldots, e_8(t)$ to the generation module 6 in order to allow for its initialisation.

At the output of the phase configuration units 60-1, . . . 60-8, the generation unit 62 generates, in a step E3, a wideband signal r(t) comprising the eight narrowband signals $e_1(t), \ldots, e_8(t)$ phase shifted by the phase configuration units 60-1, . . . 60-8.

The wideband signal r(t) generated by the generation module 6 is sent, on the one hand, to the error calculation module 12 and, on the other hand, to the linearization module 8.

The linearization module 8 applies a pre-distortion to the signal that it receives, in a step E4 (optional), then sends the signal pre-distorted as such to the power amplifier 10 which amplifies it in a step E5. The pre-distortion applied is in general according to the error $\epsilon(t)$ coming from the error calculation module 12 and received beforehand by the linearization module 8, for example at the preceding iteration.

The amplified signal s(t) is then transmitted, on the one hand, to the emission module 16 that emits it in a step E6 intended for the receiver 4 and, on the other hand, to the error calculation module 12 that calculates, in a step E7, the error $\epsilon(t)$, i.e. the difference, between the wideband signal r(t) generated by the generation module 6 and the signal amplified s(t) by the power amplifier 10, then sends it to the phase determination module 14 and to the linearization module 8.

The phase determination module 14 then calculates, in a step E8, for each one of the eight narrowband signals $e_1(t), \ldots, e_8(t)$, a phase shift value $\phi_1, \ldots, \phi_8$ of the narrowband signals $e_1(t), \ldots, e_8(t)$.

The phase shift values $\phi_1, \ldots, \phi_8$ of the narrowband signals $e_1(t), \ldots, e_8(t)$ can be calculated by minimisation of the squared error, more preferably by using a stochastic gradient that minimises said squared error as described hereinafter.

Still in reference to FIG. 1, the output signal of the generation module 6 is written:

$$r(t) = \Sigma w_i \cdot e_i(t)$$

with i varying from 1 to 8, with $w_i = e^{j \cdot \Phi_i}$
and the error, or difference, between the output signal s(t) of the power amplifier 10 and said input signal is written:

$$\epsilon(t) = s(t) - r(t),$$

where s(t)=F(r(t)) is the function carried out by the power amplifier 10.

The following is thus deduced:

$$\epsilon(t) = r(t) - F(r(t)) = G(r(t)) = G(\Sigma w_i \cdot e_i(t))$$

where g is the function that has "t" associates "r(t)−s(t)".

The phase shifts $\phi_1, \ldots, \phi_8$ of the narrowband signals $e_1(t), \ldots, e_8(t)$ are then determined by minimising the squared error.

Preferably, the phase shifts $\phi_1, \ldots, \phi_8$ of the signals are determined by using a stochastic gradient that minimises the squared error $\|\epsilon\|^2$:

$$\|\epsilon(t)\|^2 = \|G(\Sigma w_i \cdot e_i(t))\|^2$$

With: $w_i = e^{j \cdot \Phi_i}$ (j being a complex number which is the square root of −1).

We then have:

$$\frac{\partial (\|\varepsilon(t)\|^2)}{\partial \varphi_l} =$$

$$\operatorname{Re}\left( G\left(\sum e^{j \cdot \varphi_i} \cdot e_i(t)\right) \cdot \frac{\partial G\left(\sum e^{j \cdot \varphi_i} \cdot e_i(t)\right)^*}{\partial \left(\sum e^{j \cdot \varphi_i} \cdot e_i(t)\right)} \cdot e_l(t)^* \cdot (-j) \cdot e^{-j \varphi_l} \right) =$$

$$\operatorname{Im}\left( G\left(\sum e^{j \cdot \varphi_i} \cdot e_i(t)\right) \cdot \frac{\partial G\left(\sum e^{j \cdot \varphi_i} \cdot e_i(t)\right)^*}{\partial \left(\sum e^{j \cdot \varphi_i} \cdot e_i(t)\right)} \cdot e_l(t)^* \cdot e^{-j \varphi_l} \right)$$

However, an estimate of $$\frac{\partial G\left(\sum e^{j \cdot \varphi_i} \cdot e_i(t)\right)^*}{\partial \left(\sum e^{j \cdot \varphi_i} \cdot e_i(t)\right)}$$

(which is a complex derivative) makes it possible to use the formula as a term of the stochastic gradient.

A possible estimate of $$\frac{\partial G\left(\sum e^{j \cdot \varphi_i} \cdot e_i(t)\right)^*}{\partial \left(\sum e^{j \cdot \varphi_i} \cdot e_i(t)\right)} \text{ is } \frac{G\left(\sum e^{j \cdot \varphi_i} \cdot e_i(t)\right)^*}{\sum e^{j \cdot \varphi_i} \cdot e_i(t)}.$$

Preferably, a stochastic gradient is applied in order to determine the optimum phase shift values of the narrowband signals $e_1(t), \ldots, e_8(t)$ according to the relationship:

$$\varphi_{l,k+1} =$$

$$\varphi_{l,k} - \mu \cdot \operatorname{Im}\left( G\left(\sum e^{j \cdot \varphi_{i,k}} \cdot e_i(t)\right) \cdot \frac{\partial G\left(\sum e^{j \cdot \varphi_{i,k}} \cdot e_i(t)\right)^*}{\partial \left(\sum e^{j \cdot \varphi_{i,k}} \cdot e_i(t)\right)} \cdot e_l(t)^* \cdot e^{-j \cdot \varphi_{l,k}} \right)$$

where $\phi_{i,n}$ is the phase that corresponds to the $i^{th}$ narrowband signal, and n corresponds to the $n^{th}$ iteration of the algorithm of the gradient, i being greater than or equal to 1 and less than or equal to 8 in the example described.

The phase shift values $\phi_1, \ldots, \phi_8$ determined as such are then sent to the phase configuration units 60-1, ..., 60-8 of the generation module 6 so that they phase shift the narrowband signals $e_1(t), \ldots, e_8(t)$ associated in a step E9.

b) Second Embodiment of the Method According to the Invention

This second embodiment, shown in FIG. 4, is implemented by the emitting equipment 2B shown in FIG. 2.

Each phase configuration unit 60-1, ..., 60-8 of the generation module 6 receives:

in a step E1, one of the eight associated narrowband signals $e_1(t), \ldots, e_8(t)$, and
in a step E2, which can be concomitant to the step E1, a phase shift value $\phi_1, \ldots, \phi_8$ associated with said narrowband signal $e_1(t), \ldots, e_8(t)$ sent by the phase determination module 14.

During the putting into operation of the emitter 2B, predetermined phase shift values $\phi_{0-1}, \ldots, \phi_{0-8}$, chosen for example randomly, can be provided for each signal $e_1(t), \ldots, e_8(t)$ to the generation module 6 in order to allow for its initialisation.

At the output of the phase configuration units 60-1, ..., 60-8, the generation unit 62 generates, in a step E3, a wideband signal r(t) comprising the eight narrowband signals $e_1(t), \ldots, e_8(t)$ phase shifted by the phase configuration units 60-1, ... 60-8.

The wideband signal r(t) generated by the generation module 6 is received, on the one hand, by the power amplification simulator 18 from the first emitter sub-module 2B-1, and, on the other hand, by the linearization module 8 from the second emitter sub-module 2B-2.

The power amplification simulator 18 simulates in a step E4' a distortion (compression) similar to that of the power amplifier 10 by using a function f in order to provide an output signal f(r(t)) to the signal differentiator 20.

The signal differentiator 20 then determines in a step E5' the difference $\epsilon_1(t)$ between the wideband signal r(t) generated by the generation module 6 and the signal f(r(t)) simulated by the power amplification simulator 18 in a manner similar to the error calculation module 12 then sends the error value $\epsilon_1(t)$ to the phase determination module 14.

The phase determination module 14 then calculates in a step E6', for each one of the eight narrowband signals $e_1(t), \ldots, e_8(t)$, a phase shift value $\phi_1, \ldots, \phi_8$ of the narrowband signals $e_1(t), \ldots, e_8(t)$.

As hereinabove, the phase shift values $\phi_1, \ldots, \phi_8$ of the narrowband signals $e_1(t), \ldots, e_8(t)$ can be calculated by minimisation of the squared error, more preferably by using a stochastic gradient that minimises said squared error.

In this case, we have:

$$\epsilon_1(t) = r(t) - f(r(t)) = g(r(t)) = g(\Sigma w_i \cdot e_i(t))$$

with:

$$w_i = e^{j \cdot \Phi_i}$$

and:

$$\frac{\partial(\|\varepsilon_1(t)\|^2)}{\partial \varphi_l} = \text{Im}\left(g\left(\sum e^{j\cdot\varphi_i} \cdot e_i(t)\right) \cdot \frac{\partial g\left(\sum e^{j\cdot\varphi_i} \cdot e_i(t)\right)^*}{\partial(\sum e^{j\cdot\varphi_i} \cdot e_i(t))} \cdot e_l(t)^* \cdot e^{-j\cdot\varphi_l}\right)$$

where g is the function that has "x" associates "x-f(x)".
as g is known, $$\frac{\partial g(x)^*}{\partial x}$$

can be determined more easily than in the case of an actual power amplifier 10 described in the first embodiment.

The formula of the gradient is then given by the relationship:

$$\varphi_{l,k+1} = \varphi_{l,k} - \mu \cdot \text{Im}\left(g\left(\sum e^{j\cdot\varphi_{i,k}} \cdot e_i(t)\right) \cdot \frac{\partial g\left(\sum e^{j\cdot\varphi_{i,k}} \cdot e_i(t)\right)^*}{\partial(\sum e^{j\cdot\varphi_{i,k}} \cdot e_i(t))} \cdot e_l(t)^* \cdot e^{-j\cdot\varphi_{l,k}}\right)$$

where $\phi_{i,n}$ corresponds to the $i^{th}$ narrowband signal, and n corresponds to the $n^{th}$ iteration of the algorithm of the gradient.

In the precise case where f is a real function (corresponding to a compression function), it will be noted that $$\frac{\partial g(x)^*}{\partial x}$$

is a positive real scalar.

This means that the modification in the formula of the gradient is carried out, for the vector comprised of the $w_i$, in the direction opposite the vector comprised of the elements $\text{Im}(g(\Sigma e^{j\cdot\Phi_i}\cdot e_i(t))\cdot e_i(t)^*\cdot e^{-j\cdot\Phi_i})$, i.e. opposites to the vector comprised of the elements $\text{Im}(r(t)\cdot e_i(t)^*\cdot e^{-j\cdot\Phi_i})$.

The phase shift values determined as such are then sent to the phase configuration units 60-1, . . . 60-8 of the generation module 6 so that they phase shift the narrowband signals $e_1(t)$, . . . , $e_8(t)$ associated in a step E7'.

The linearization module 8 applies, using an error $\epsilon_2(t)$ calculated by the error calculation module 12 (for example at the preceding iteration), a pre-distortion to the signal that it receives, in a step E8' (optional), then sends the signal pre-distorted as such to the power amplifier 10 which amplifies it in a step E9'.

The amplified signal is then transmitted, on the one hand, to the emission module 16 that emits it intended for the receiver 4 in a step E10' and, on the other hand, to the error calculation module 12 that calculates, in a step E11', a new error $\epsilon_2(t)$ that corresponds to the difference between the wideband signal r(t) generated by the generation module 6 and the signal s(t) amplified by the power amplifier 10, then provides it to the linearization module 8 in such a way that the linearization is carried out by iteration.

Note that the steps E8' to E11' are optional.

Figure 6:
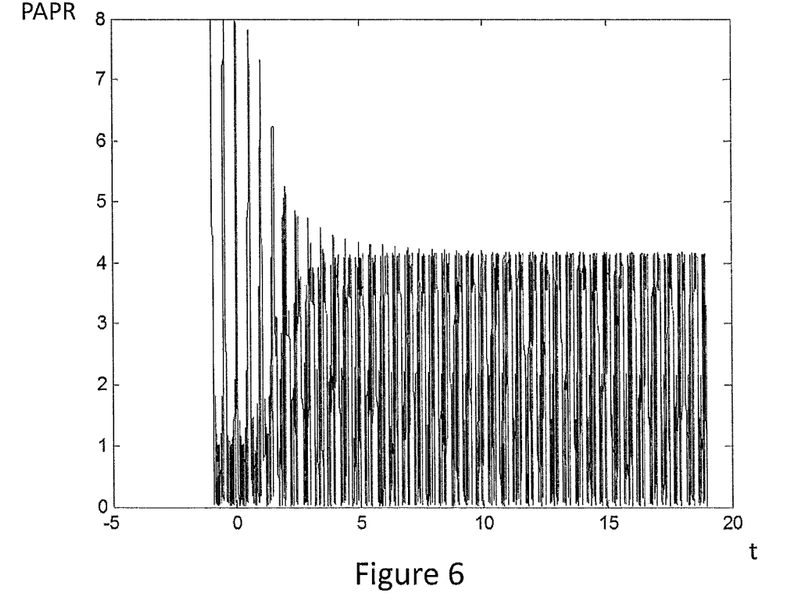
FIG. 6 shows a first application example of the second embodiment of the method according to the invention.

FIG. 6 shows a first example of convergence of the crest factor for eight narrowband signals inserted into a single wideband signal for the second embodiment using a power amplification simulator 18. In this first example, the narrowband signals are pure carriers.

In this example, the narrowband signals are spaced in frequency in a regular manner. The power of each narrowband signal is equal to 1. The average power for the global signal comprising the 8 narrowband signals is equal to 8. The maximum power is equal to 64 when the 8 signals are in coherence. The PAPR is therefore equal, without processing, to 64/8=8, i.e. equal to about 9 dB.

In this example, the function used is the function f2 shown in FIG. 3 and the output limit value "Target", expressed in terms of amplitude is 4. It is therefore equal to 16 in terms of power. The phases of the narrowband signals are all identical and equal to zero at the start of the implementation. In other terms, their phase shift is null.

It is also observed that the method according to the invention makes it possible to reduce the crest factor (PAPR) from an original value equal to about 9 dB to a value equal to about 4 dB.

Figure 7:
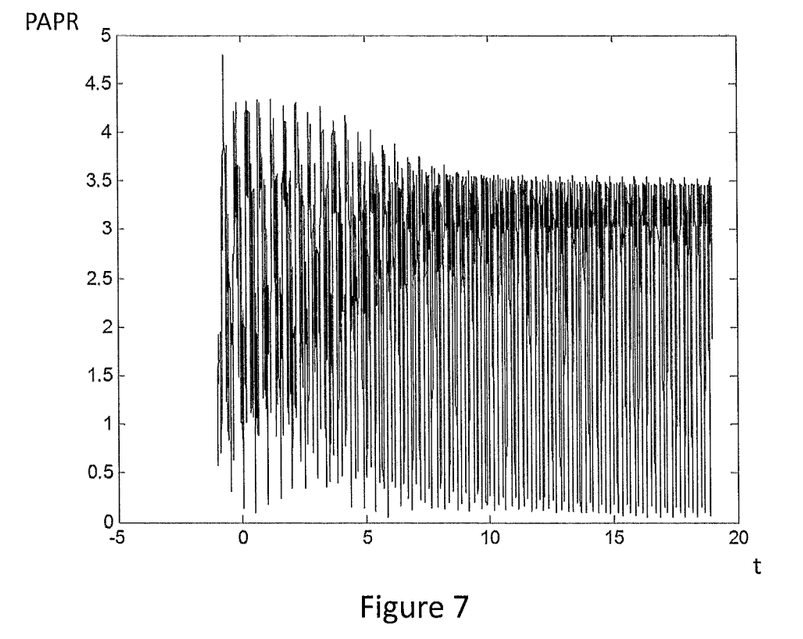
FIG. 7 shows a second application example of the second embodiment of the method according to the invention.

FIG. 7 shows a second example of convergence of the crest factor for eight narrowband signals inserted into a single wideband signal for the second embodiment using a power amplification simulator 18. In this second example, the narrowband signals are also pure carriers.

In this example, the narrowband signals are spaced in frequency in a regular manner. The power of each narrowband signal is equal to 1. The average power for the global signal comprising the 8 narrowband signals is equal to 8. The maximum power is equal to 64 when the 8 signals are in coherence. The PAPR is therefore equal, without processing, to 64/8=8, i.e. equal to about 9 dB.

In this example, the narrowband signals are spaced regularly, the function used is the function f2 shown in FIG. 3 and the output limit value "Target", expressed in terms of amplitude is 3.4, which corresponds to 11.56 in terms of power. The phases of the narrowband signals are chosen randomly at the start of the implementation.

It is also observed that the method according to the invention makes it possible to reduce the crest factor (PAPR) from an original value equal to about 5.6 dB to a value equal to about 1.85 dB.

When the coherence between the narrowband signals, expressed as base band, is only partial or is limited solely to a portion of time of these signals, for example in the case of TETRAPOL with the learning sequences and when the TETRAPOL signals are all synchronised between them, it is preferable to use different pitches in the algorithm of the gradient. For TETRAPOL, for example a fast pitch on the learning sequence is chosen and a slower pitch outside of the latter. Another embodiment consists in carrying out the adaptation of the phase shifts only on the learning sequences. Reducing the PAPR will be lower than in the case where the coherence is complete between the narrowband signals, expressed as base band, but the processing provides a substantial improvement in the statistic distribution of the amplitude of the resulting signal, which contributes to reducing the distortion that the wideband signal is subjected to at the output of the power amplifier.

In a third embodiment (not shown), the phase determination module 14 is configured to determine phase shift values randomly, which makes it possible to reduce the crest factor but not optimally. In this embodiment, the method comprises a periodic step of generating a wideband signal using randomly phase shifted narrowband signals which is interrupted when the crest factor is less than a reference crest factor value.

Of course, other embodiments can be considered. More particularly, the determining of the phase of the narrowband signals can be carried out in any suitable manner that makes it possible to phase shift narrowband signals between them.

The invention claimed is:

1. A method for reducing a power crest factor of a wideband communication signal generated by a generation module of a communications emitting equipment, the wideband signal comprising N narrowband signals, N being a natural integer greater than or equal to two, the method comprising:
calculating, by a phase shift determination module, a different phase shift value for each of the N narrowband signals; and
amplifying, by a power amplifier and/or a power amplification simulator, the power of said wideband signal for wireless transmission,
wherein, the generation module shifts the respective phases of the narrowband signals in accordance with the calculated phase shift values in order to reduce said power crest factor, and
wherein the calculation of the phase shift values is based on a difference between a value of the wideband signal after being amplified by said power amplifier and/or said power amplification simulator and a value of the wideband signal generated by the generation module prior to amplification.

2. The method according to claim 1, wherein the phase shift values of the narrowband signals are determined in a preliminary step.

3. The method according to claim 1, wherein the phase shift values of the narrowband signals are determined periodically.

4. The method according to claim 1, wherein the phase shift values of the narrowband signals are determined using signals emitted at a prior instant by the emitting equipment.

5. The method according to claim 1, wherein the phase shift values of the narrowband signals are determined by using a stochastic gradient that minimises said squared difference.

6. The method according to claim 1, wherein the phase shift values of the narrowband signals are determined randomly.

7. The method according to claim 6, wherein the phase shift values of the narrowband signals are determined periodically.

8. A communications emitter equipment comprising:
a generation module configured to generate a wideband communication signal comprising N narrowband signals, N being a natural integer greater than or equal to two;
a phase shift determination module configured to calculate a different phase shift value for each of the N narrowband signals; and
a power amplifier to increase the power of said wideband signal for wireless transmission,
wherein the calculation of the phase shift values are based on a difference between a value of the wideband signal after being amplified by said power amplifier and a value of the wideband signal generated by the generation module prior to amplification, and
wherein the generation module applies the calculated different phase shift values to shift the respective phases of the narrowband signals in order to reduce a power crest factor of the wideband signal and, when the narrowband signals are at least partially coherent between them, to optimise the statistical distribution of amplitudes of the transmitted wideband signal.

9. The emitter equipment as claimed in claim 8, further comprising a power amplification simulator configured to simulate the amplification of a wideband signal generated by the generation module.

* * * * *